(12) United States Patent
McKee

(10) Patent No.: US 8,130,301 B2
(45) Date of Patent: *Mar. 6, 2012

(54) SPLIT TRUNK PIXEL LAYOUT

(75) Inventor: Jeffrey A. McKee, Meridian, ID (US)

(73) Assignee: Aptina Imaging Corporation, George Town (KY)

( * ) Notice: Subject to any disclaimer, the term of this patent is extended or adjusted under 35 U.S.C. 154(b) by 577 days.

This patent is subject to a terminal disclaimer.

(21) Appl. No.: 12/244,578

(22) Filed: Oct. 2, 2008

(65) Prior Publication Data

US 2009/0045443 A1 Feb. 19, 2009

Related U.S. Application Data

(63) Continuation of application No. 11/126,307, filed on May 11, 2005, now Pat. No. 7,446,357.

(51) Int. Cl.
*H04N 5/374* (2011.01)
*H01L 31/101* (2006.01)

(52) U.S. Cl. ........................................ 348/308; 257/292

(58) Field of Classification Search .................. 257/291, 257/292, 293; 348/308; 250/208.1
See application file for complete search history.

(56) References Cited

U.S. PATENT DOCUMENTS

| | | | |
|---|---|---|---|
| 5,488,239 A | 1/1996 | Jung | |
| 5,614,744 A * | 3/1997 | Merrill | 257/291 |
| 6,107,655 A * | 8/2000 | Guidash | 257/292 |
| 6,160,281 A | 12/2000 | Guidash | |
| 6,218,656 B1 | 4/2001 | Guidash | |
| 6,352,869 B1 | 3/2002 | Guidash | |
| 6,423,994 B1 | 7/2002 | Guidash | |
| 6,552,323 B2 | 4/2003 | Guidash et al. | |
| 6,657,665 B1 | 12/2003 | Guidash | |
| 6,977,684 B1 * | 12/2005 | Hashimoto et al. | 250/208.1 |
| 7,332,786 B2 | 2/2008 | Altice et al. | |
| 2002/0121656 A1 | 9/2002 | Guidash | |
| 2003/0015738 A1 * | 1/2003 | Kwon | 257/233 |
| 2004/0046104 A1 | 3/2004 | Rhodes | |
| 2004/0159861 A1 | 8/2004 | Mori et al. | |
| 2004/0169127 A1 * | 9/2004 | Ohkawa | 250/208.1 |
| 2005/0184322 A1 * | 8/2005 | Inoue | 257/292 |
| 2006/0197169 A1 * | 9/2006 | Cole | 257/431 |
| 2006/0231875 A1 | 10/2006 | Patrick et al. | |
| 2006/0255381 A1 | 11/2006 | McKee | |
| 2006/0256221 A1 | 11/2006 | McKee et al. | |

(Continued)

FOREIGN PATENT DOCUMENTS

DE  198 27 020 A1  12/1999

(Continued)

OTHER PUBLICATIONS

Chinese Office Action corresponding to Chinese Patent Application No. 2006800158589.

(Continued)

*Primary Examiner* — Jason Whipkey
(74) *Attorney, Agent, or Firm* — Jason Tsai

(57) ABSTRACT

A pixel array architecture having multiple pixel cells arranged in a split trunk pixel layout and sharing common pixel cell components. The array architecture increases the fill factor, and in turn, the quantum efficiency of the pixel cells. The common pixel cell components may be shared by a number of pixels in the array, and may include several components that are associated with the storage and readout of a signal from the pixel cells.

13 Claims, 6 Drawing Sheets

U.S. PATENT DOCUMENTS

| | | |
|---|---|---|
| 2007/0012964 A1 | 1/2007 | McKee |
| 2007/0013797 A1 | 1/2007 | McKee |
| 2007/0023798 A1 | 2/2007 | McKee |
| 2007/0034884 A1 | 2/2007 | McKee |
| 2007/0035649 A1 | 2/2007 | McKee |
| 2007/0040922 A1 | 2/2007 | McKee et al. |
| 2007/0045679 A1 | 3/2007 | McKee et al. |
| 2007/0046796 A1 | 3/2007 | McKee |
| 2007/0052055 A1 | 3/2007 | McKee |
| 2007/0152292 A1 * | 7/2007 | Toros et al. .................. 257/463 |

FOREIGN PATENT DOCUMENTS

| | | |
|---|---|---|
| EP | 0 954 032 A2 | 11/1999 |
| EP | 1 091 409 A2 | 4/2001 |
| EP | 1 139 428 A2 | 10/2001 |
| WO | WO 2004/047428 A1 | 6/2004 |

OTHER PUBLICATIONS

International Search Report.

* cited by examiner

SPLIT TRUNK PIXEL LAYOUT

CROSS REFERENCE TO RELATED APPLICATIONS

The present application is a continuation of U.S. patent application Ser. No. 11/126,307, filed on May 11, 2005 now U.S. Pat. No.7,446,357, the disclosure of which is incorporated by reference in its entirety.

FIELD OF THE INVENTION

The present invention relates generally to digital image sensors and in particular to a pixel cell array architecture have a high quantum efficiency.

BACKGROUND OF THE INVENTION

Typically, a digital imager array includes a focal plane army of pixel cells, each one of the cells including a photosensor, e.g., a photogate, photoconductor, or a photodiode. In a CMOS imager a readout circuit is connected to each pixel cell which typically includes a source follower output transistor. The photosensor converts photons to electrons which are typically transferred to a storage node, e.g., a floating diffusion region connected to the gate of the source follower output transistor. A charge transfer device (e.g., transistor) can be included for transferring charge from the photosensor to the floating diffusion region. In addition, such imager cells typically have a transistor for resetting the storage node to a predetermined charge level prior to, charge transference. The output of the source follower transistor is gated as a pixel output signal by a row select transistor.

Exemplary CMOS imaging circuits, processing steps thereof, and detailed descriptions of the functions of various CMOS elements of an imaging circuit are described, for example, in U.S. Pat. Nos. 6,140,630, 6,376,868, 6,310,366, 6,326,652, 6,204,524, 6,333,205, each assigned to Micron Technology, Inc. The disclosures of each of the forgoing patents are hereby incorporated by reference in their entirety.

With reference to FIGS. 1 and 2, which respectively illustrate a top-down and a cross-sectional view of a conventional CMOS pixel cell 100, when incident light 187 strikes the surface of a photodiode photosensor 120, electron/hole pairs: are generated in the p-n junction of the photodiode photosensor 120 (represented at the boundary of n-accumulation region 122 and p+ surface layer 123). The generated electrons (photocharges) are collected in the n-type accumulation region 122 of the photosensor 120. The photo-charges move from the initial charge accumulation region 122 to a floating diffusion region 110 via a transfer transistor 106. The charge at the floating diffusion region 110 is typically converted to a pixel output voltage by a source follower transmitter 108 and subsequently output on a column output line 111 via a row select transistor 109.

Conventional CMOS imager designs, such as that shown in FIG. 1 for pixel cell 100, provide approximately a fifty percent fill factor, meaning only half of the cell 100 is dedicated to converting light to charge carriers. As shown, only a small portion of the cell 100 comprises a photosensor 120 (e.g., photodiode). The remainder of the pixel cell 100 includes isolation regions 102, shown as STI regions in a substrate 101, the floating diffusion region 110 coupled to a transfer gate 106' of the transfer transistor 106, and source/drain regions 115 for reset 107, source follower 108, and row select 109 transistors having respective gates 107', 108', and 109'. In the conventional pixel cell 100 layout, each of the reset, source follower and row select transistor gates 107', 108' and 109' are aligned consecutively, sharing source/drain regions 115 and requiting significant surface area for each pixel cell 100. As desired scaling of pixels continues to decrease the pixel's 100 total area, it becomes increasingly important to create high sensitivity photosensors that utilize a minimum amount of surface area, or to find more efficient pixel cell layouts to minimize the area required by non-photosensitive components of the pixel cell in order to maintain relatively large areas for the photosensors.

In addition, conventional storage nodes, such as floating diffusion region 110, have a limited amount of charge storage capacity. Once this capacity is reached, a pixel cell becomes less efficient. Once the charge storage capacity is exceeded, an undesirable phenomenon, known as "blooming" occurs, whereby the "over-capacity" charges escape to undesirable parts of the pixel cell 100 or to adjacent pixel cells. One suggested solution for dealing with this limited charge storage capacity is to add a capacitor which is connected to the floating diffusion region 110. The capacitor is used to store the additional over-capacity charges so the charges do not flow to other areas of the cell or adjacent cells. The problem with this solution, however, is that the additional capacitor takes up space in the cell that could otherwise be used to increase the size of the cell's photosensor, thereby decreasing the potential fill factor for the pixel cells and overall array.

Accordingly, there is a need and desire for a more efficient pixel cell array architecture that has an improved fill factor and charge storage capacity.

BRIEF SUMMARY OF THE INVENTION

The present invention, as illustrated in the various exemplary embodiments, provides a pixel cell array architecture having multiple pixel cells arranged in a split trunk pixel layout and sharing common pixel cell components. The pixel cell and array architecture increases the fill factor, and in turn, the quantum efficiency of the pixel cell array. The common pixel cell components are shared by a number of pixel cells in the array, and may include several components that are associated with the readout of a signal from the pixel cells. The split trunk layout may provide a transfer transistor and a reset transistor, separated by a floating diffusion region, on one trunk, and a source follower transistor and row select transistor on a separate trunk. Each trunk has a respective active device area.

In accordance with exemplary embodiments of the invention, the pixel cell architecture includes a shared transfer gate floating diffusion region and a reset gate for multiple pixels, located on a first trunk, which is separated from a shared row select and source follower transistor on a second trunk. In yet other exemplary embodiments, the source follower transistor gate is part of a bottom electrode for a capacitor.

BRIEF DESCRIPTION OF THE DRAWINGS

The foregoing and other aspects of the invention will be better understood from the following detailed description of the invention, which is provided in connection with the accompanying drawings, in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, epitaxial, silicon-on-insulator (SOI) or silicon-on-sapphire (SOS) technology, doped and undoped semiconductors, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photosensor and associated transistors for converting photons to an electrical signal. For purposes of illustration, representative pixel cells are described; however, the invention is not limited to pixel cells having the representative component parts. Accordingly, the following detailed description is not to be taken in a limiting sense, and the scope of the present invention is defined only by the appended claims.

The terms "at an angle," "angled," and "slanted," as used herein are to be interpreted as meaning at any angle, with respect to some stated reference point, that is not exactly parallel or exactly perpendicular. Accordingly, when a portion of an object and some reference point meet to form an angle that is not 0°, 90°, or 180°, the object is considered "angled," "at an angle," or "slanted" with respect to the reference point.

Figure 1:
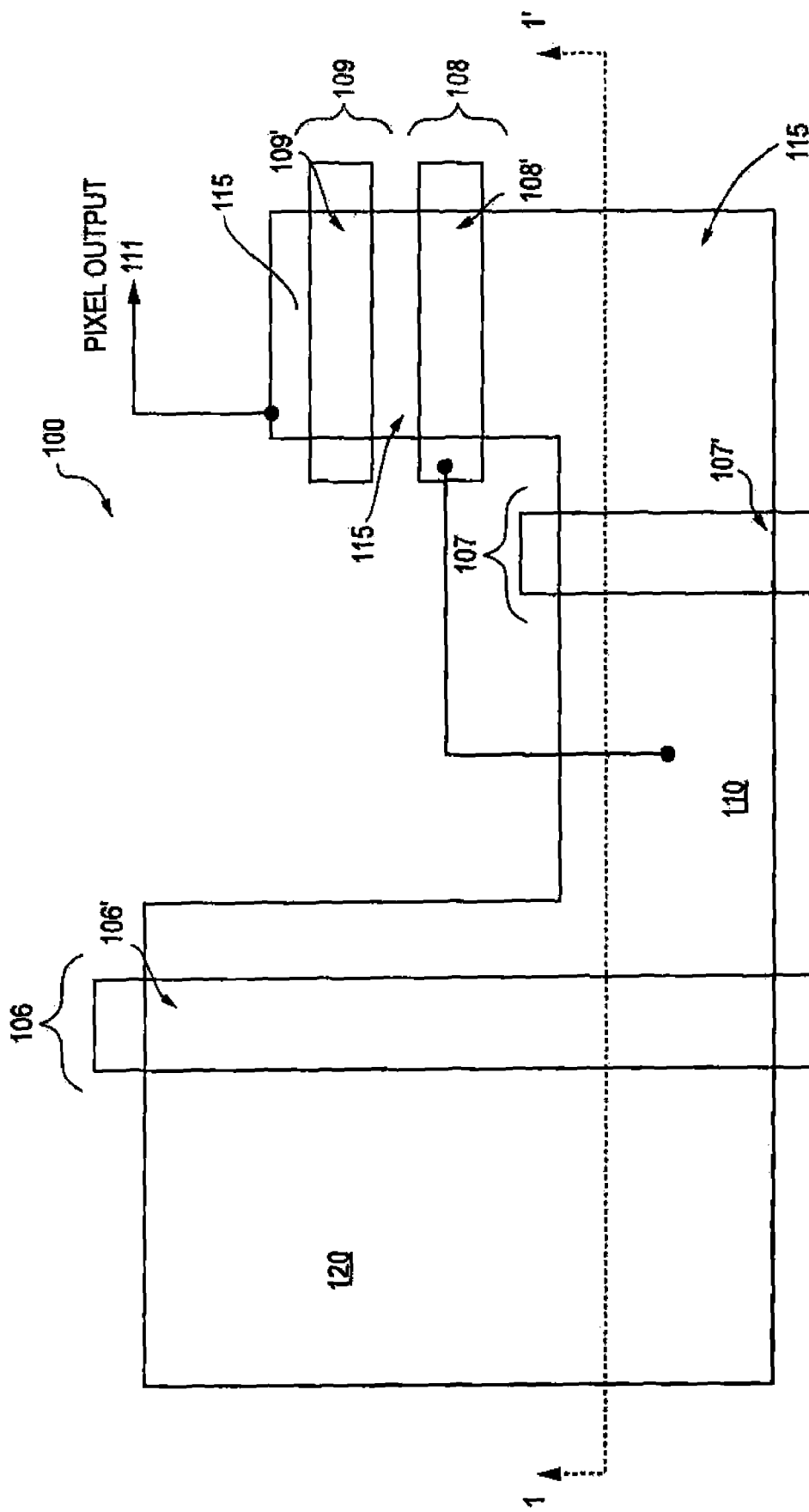
FIG. 1 is a top-down view of a conventional CMOS pixel cell.
Figure 2:
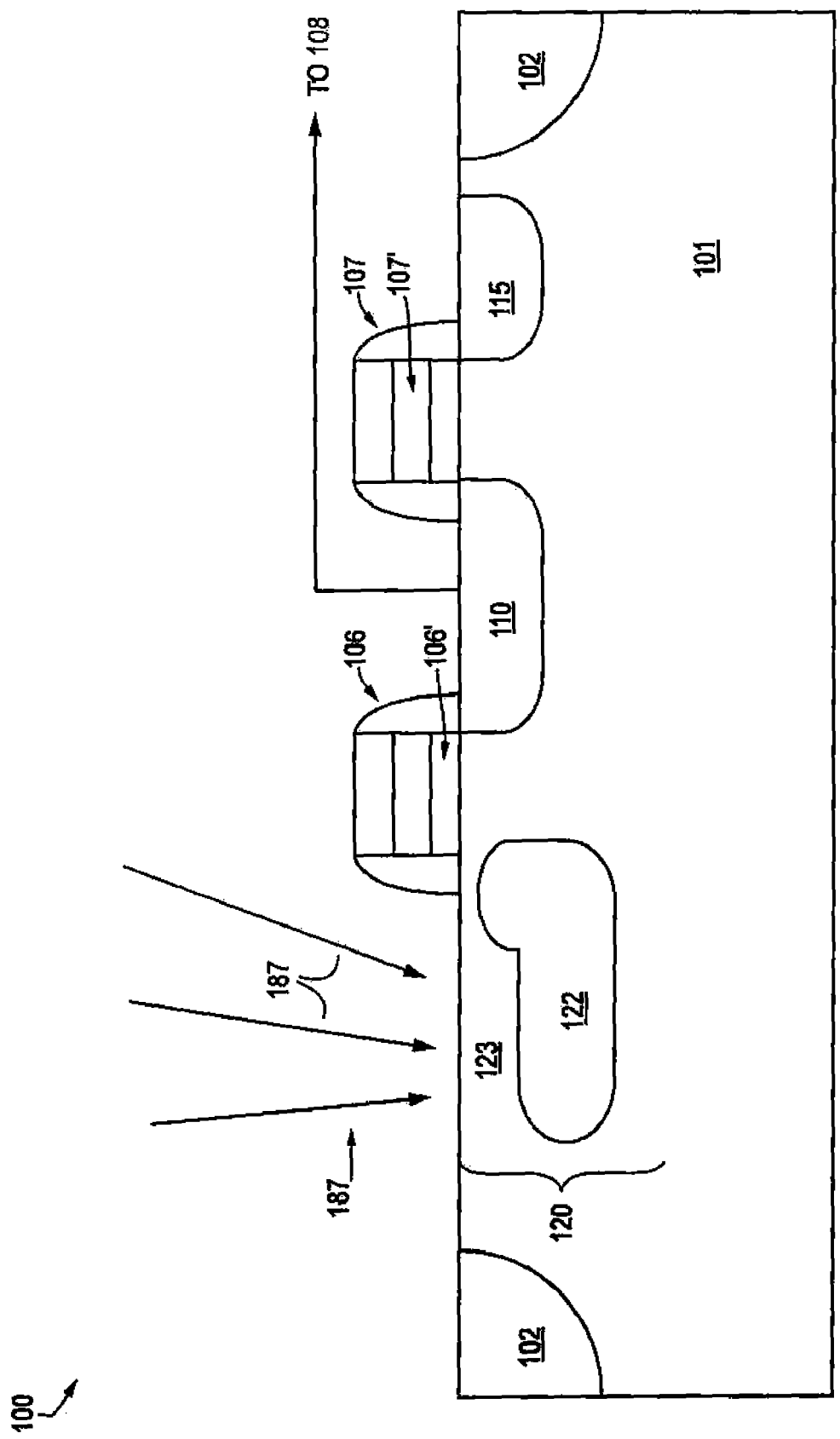
FIG. 2 is a cross-sectional view of the pixel cell of FIG. 1, taken along line 1-1'.
Figure 3:
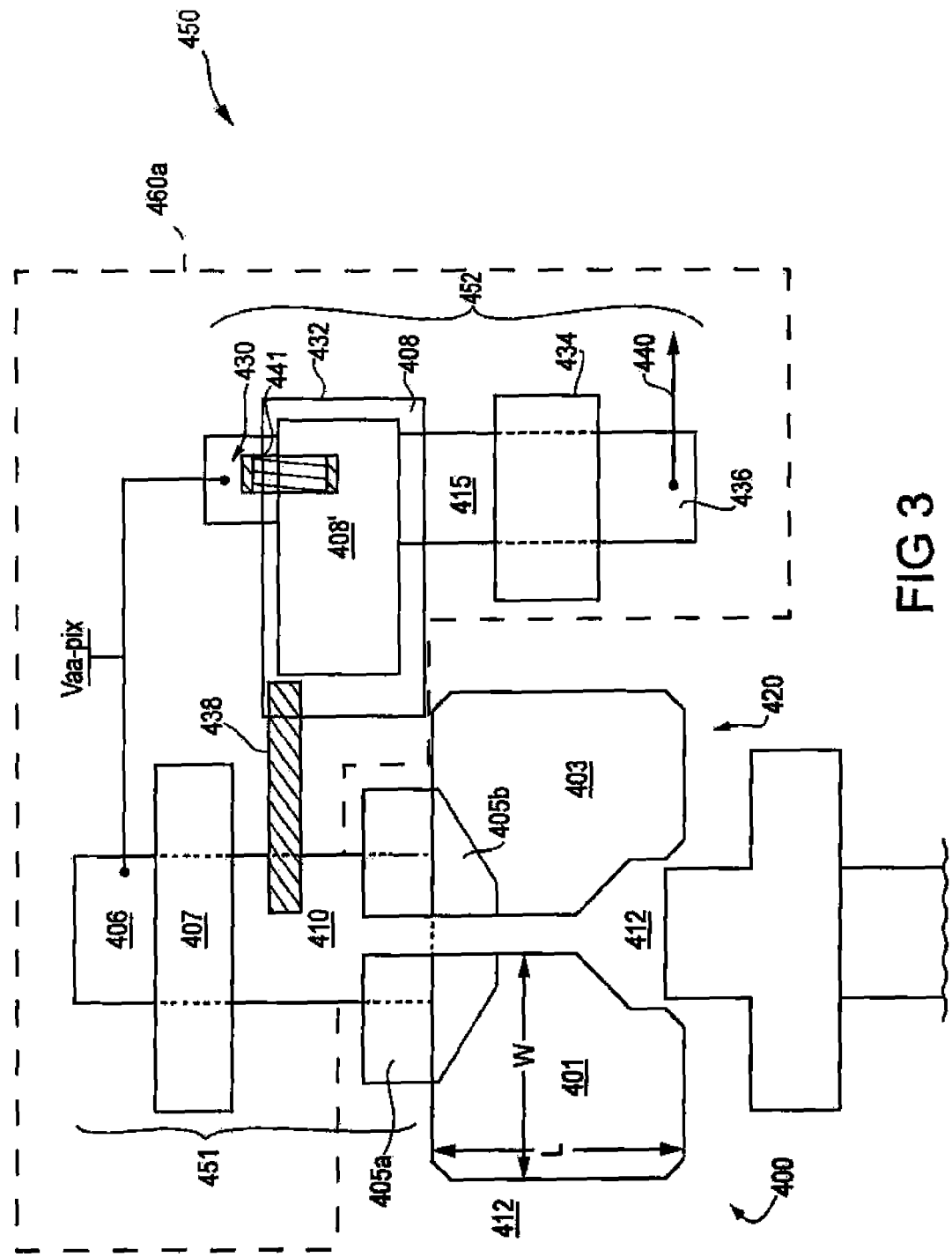
FIG. 3 is a top-down view of a portion of a CMOS pixel cell array constructed in accordance with an exemplary embodiment of the invention.
Figure 4:
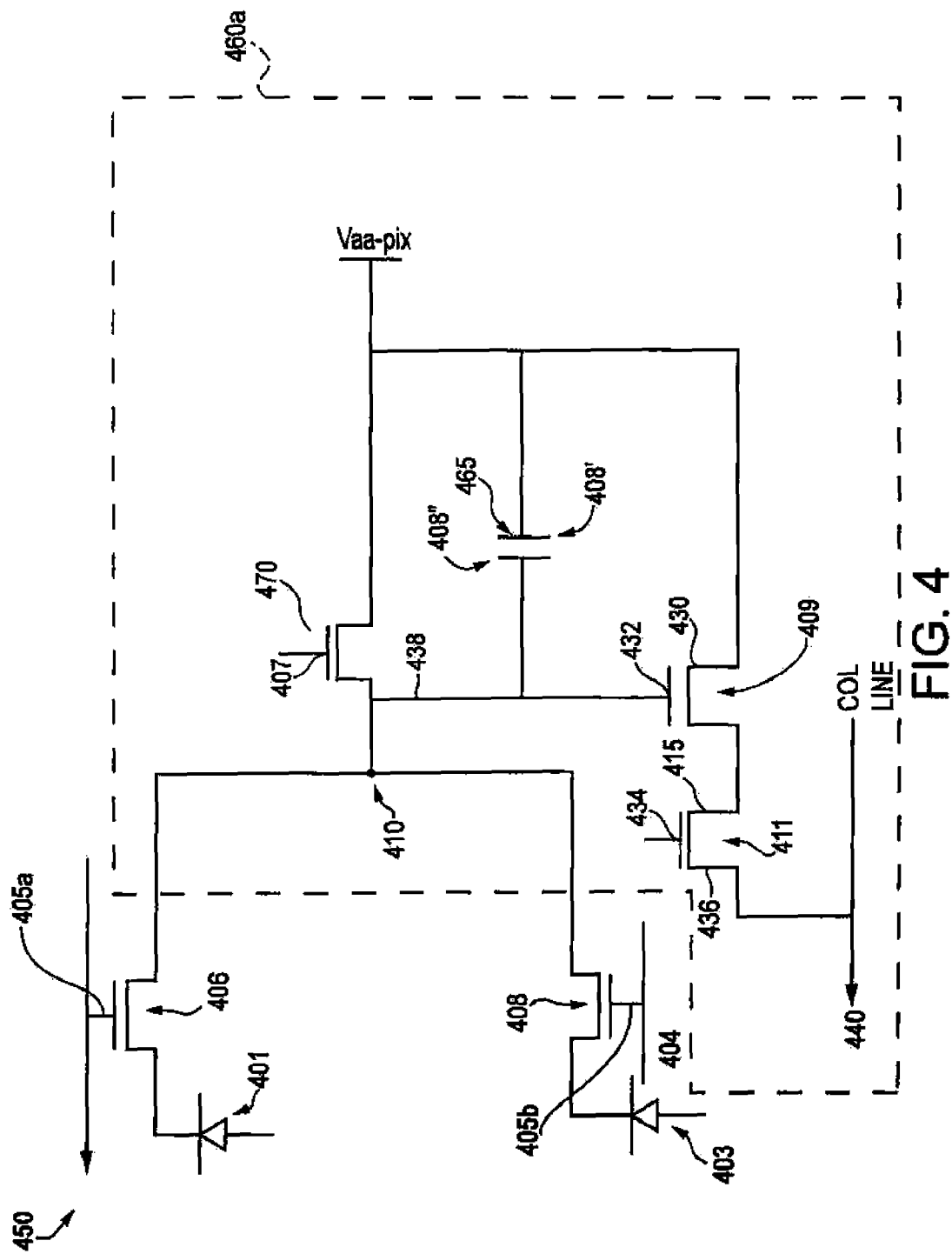
FIG. 4 is a circuit diagram of the portion of the exemplary pixel cell array shown in FIG. 3.

Turning to the Figures, where like numerals represent like elements, a first embodiment of the invention will now be described in connection with FIGS. 3 and 4. FIG. 3 is a top-down view of a substrate having a layout in accordance with a first embodiment of the invention. FIG. 4 shows the electrical circuit for the FIG. 3 embodiment.

In FIGS. 3 and 4, two row adjacent pixels 400, 420 form a portion of an exemplary pixel array. The dotted line designated as 460 represents a common shared pixel structure, which is shared by two pixels 400, 420, each formed by the common structure 460 and one of the photosensors, e.g. photodiodes, 401 and 403, respectively. The common shared architecture illustrated in 460 includes a split trunk pixel design. A first of the split trunks 451 has a respective active device region and is designated by a pair of transfer transistors respectively associated with each of the photosensors 401 and 403 and having respective transfer transistor gates 405$a$, 405$b$. The first split trunk 451 also has a common floating diffusion region 410, a gate 407 of a reset transistor 470, and a source/drain region 406, also associated with the reset transistor 470, which in practice is connected to a supply voltage, designated in FIG. 3 as $V_{aa\text{-}pix}$. The other portion of the split trunk 452, which also has a respective active area, includes a source/drain region 430, connectable to the supply voltage $V_{aa\text{-}pix}$, a source follower transistor gate 432, a source/drain region 415, a gate 434 for a row select transistor and another source/drain region 436 which forms a column output for the shared pixels 400, 420.

In the structures illustrated in FIG. 3, the gate 432 of the source follower transistor is also one electrode 408" of a capacitor, the other electrode of which is designated as 408'. A conductor 438 is shown in FIG. 3 as interconnecting the floating diffusion region 410 and the gate electrode 432 of the source follower transistor 409. Although shown in FIG. 3 as a buried conductor, that is a conductor close to the surface of the substrate, conductor 438 could also be implemented through upper layer metallizaton levels, which are well known in the art. An additional buried conductor 441 is illustrated as interconnecting the electrode 408" of the capacitor 408 with the source/drain region 430, which is in turn connected to the supply voltage $V_{aa\text{-}pix}$.

FIG. 3 illustrates two pixels 400, 420 sharing common structure embraced by the dotted line 460. Each pixel has a respective photosensor associated therewith 401, 403. Thus, one pixel 400 is formed by the photosensor 401 and common structure 460, and the other pixel 420 is formed by the photosensor 403 and the common structure 460. An isolation region 412 isolates the two adjacent photosensors 401, 403.

The pixel architectures depicted in the embodiment illustrated in FIGS. 3, 4 are replicated many times in a pixel array both horizontally and vertically. The advantage of a split trunk architecture for the pixel is greater flexibility in the placement of the transistor structures required for operation of the pixels. In addition, because pixels share storage and readout architecture, it is not necessary to have a separate storage and readout architecture for each pixel, thereby permitting either a more dense pixel structure or a greater area for the photosensors 401, 403. In the illustrated embodiments, the first of the split trunk 451 active device regions is located in the area partially between and just above the photosensors 401, 403. The second trunk 452 active region is located between the first pair of pixels 400, 420 and an adjacent second pair of pixels (not shown), residing above the pixel pair 400, 420 in FIG. 3.

In the exemplary embodiment illustrated above, at least a portion 451 of the transfer gates 405$a$, 405$b$ (FIG. 3) is angled with respect to the photosensors 401, 403. For example, with reference to FIG. 3, sides of each gate 405$a$, 405$b$ are shown as being slanted with respect to the length L and the width W of the associated photosensors 401, 403. This angled geometry of the transfer gates 405$a$, 405$b$ allows for an efficient layout of the transfer gate. In addition, this angled layout is also beneficial in maximizing the fill factor of the pixel cells, by maximizing the area of the photosensor 401, 403 for each pixel.

As noted in accordance with the invention, the shared components for the two pixel cells are arranged in a split trunk design, defined by active device regions of the two trunks 451, 452. The two active regions are electrically connected via a conductor 438 which may be formed as a buried conductor close to the surface of a substrate on which the pixels are formed or in a wiring layer above the surface of the pixel array 450, and it may electrically connect the source follower gate 432 to the floating diffusion region 410. Any suitable conductive material may be used to form the interconnect layer 417. It should be understood that other split trunk layouts are also within the scope of the invention, as the invention is not limited to the layout shown in the FIG. 3 exemplary embodiment.

In addition, in accordance with the split trunk pixel architecture, the source follower gate 432 area may be increased, which reduces the fixed-pattern noise of the pixel cells 400, 420 without decreasing the fill factor. The illustrated embodiment also permits the gate 432 to act as one electrode 408" of a shared capacitor 465, which is electrically connected between the floating diffusion region 410 and supply voltage $V_{aa\text{-}pix}$. Shared capacitor 465 can be used to increase the charge storage capacity of the floating diffusion region 410 and the quantum efficiency of the pixels 400, 420, and the dual use of the source follower transistor 409 gate 432 as capacitor electrode 408" maximizes the capacitor 465 area while minimizing loss of photosensor area.

The shared pixel structures 460 and may be formed in a substrate using known methods of transistor fabrication to form the transistors as described herein in the embodied split trunk pixel layouts illustrated in FIG. 3. The photosensors 401, 403 can be formed as any suitable photosensitive structure for converting light photons into electrons (photocharges). In a preferred embodiment, the photosensors 401, 403 are pinned photodiode regions, however, they may be formed as photogates, Schottky diodes, or as another photo-sensing device compatible with the invention. Methods for forming an isolation region 412 between photosensors 401, 403 may include formation of a shallow trench isolation (STI) region, or any other acceptable isolation technique may also be used. These isolation techniques may also be employed to isolate active area portions of the trunks 451, 452 from one mother, for isolating active areas from the photosensors 401, 403, and for isolating one pixel from another. As noted above, acceptable methods of forming conductors 438, 441 may include the formation of buried interconnection near a surface of the substrate or metallization wiring in layers above the substrate. If a capacitor 465 is desired, an electrode 408" of this capacitor may be formed, in accordance with a preferred embodiment of the invention, as a gate 432 of a source follower transistor. Capacitor 465, which can be shared among pixel cells, may be alternatively be formed in other locations, for example, it may be formed over a common floating diffusion region 410.

Figure 5:
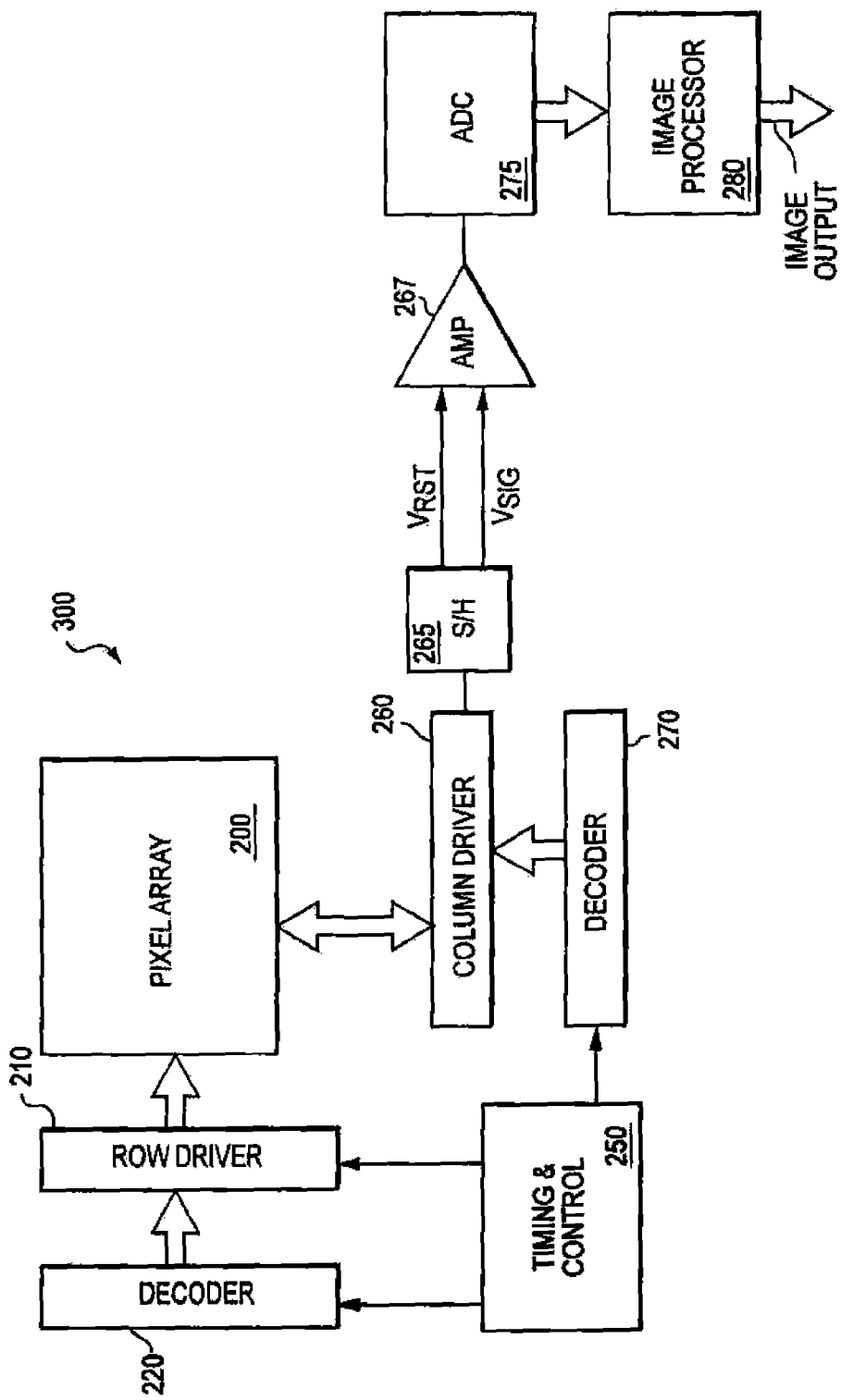
FIG. 5 is a block diagram of a CMOS imager chip having an array of pixel cells constructed in accordance with the invention.

FIG. 5 illustrates a block diagram of an exemplary CMOS imager 300 having a pixel array 200 formed of pixel cells constructed in accordance with a split trunk embodiment described above. Pixel array 200 comprises a plurality of pixels arranged in a predetermined number of columns and rows (not shown). Attached to the array 200 is signal processing circuitry, as described herein. The pixels of each row in array 200 can be simultaneously operated, and the pixels of each column are selectively output by respective column select lines. A plurality of row and column lines are provided for the entire array 200. The row lines are selectively activated by a row driver 210 in response to row address decoder 220. The column select lines are selectively activated by a column driver 260 in response to column address decoder 270. Thus, a row and column address is provided for each pixel.

The CMOS imager 300 is operated by the timing and control circuit 250, which controls address decoders 220, 270 for selecting the appropriate row and column lines for pixel readout. The control circuit 250 also controls the row and column driver circuitry 210, 260 such that these apply driving voltages to the drive transistors of the selected row and column lines. The pixel column signals, which typically include a pixel reset signal ($V_{rst}$), taken as a pixel output after the floating diffusion region 410 is reset, and a pixel image signal ($V_{sig}$), taken after charges accumulated in the photosensor are gated to the floating diffusion region 410 by the transfer transistor 405, are read by a sample and hold circuit 265 associated with the column drive 260. A differential signal ($V_{rst}$–$V_{sig}$) is produced by differential amplifier 267 for each pixel. The differential signal is digitized by an analog-to-digital converter 275 (ADC). The analog-to-digital converter 275 supplies the digitized pixel signals to an image processor 280 which forms and outputs a digital image.

Figure 6:
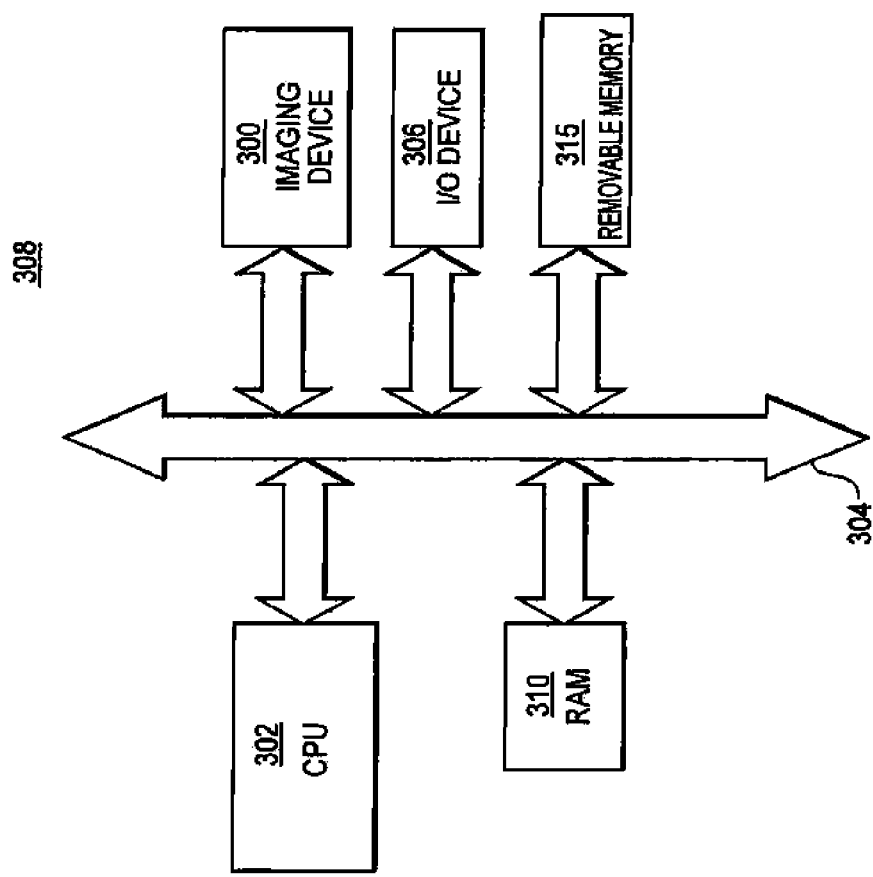
FIG. 6 is a schematic diagram of a processing system employing a CMOS imager constructed in accordance with the invention.

FIG. 6 shows a processor system 308, which includes an imager 300 constructed in accordance with an embodiment of the invention. The processor system 308 may be part of a digital camera or other imaging system. The imager 300 may receive control or other data from system 308. System 308 includes a processor 302 having a central processing unit (CPU) for image processing, or other image handling operations. The processor 302 communicates with various devices over a bus 304. Some of the devices connected to the bus 304 provide communication into and out of the system 308; an input/output (I/O) device 306 and an imaging device, i.e., imager 300, are such communication devices. Other devices connected to the bus 304 provide memory, for instance, a random access memory (RAM) 310 or a removable memory 315.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. For example, although the invention is discussed only with reference to pixel arrays having a 2-pixel sharing of component parts between column adjacent pixels, other multi-pixel sharing arrays are also intended to be within the scope of the invention, and the split trunk design may be implemented with any pixel cell array. Additionally, any modifications, though presently unforeseeable, of the present invention that come within the spirit and scope of the following claims should be considered part of the present invention.

What is claimed as new and desired to be protected by Letters Patent of the United States is:

1. A method of forming a pixel cell array comprising a plurality of pixels, the method comprising:
    forming first and second photosensors for generating photocharges in response to applied light;
    forming a first trunk including a transfer gate, the transfer gate for transferring the photocharges from each of the first and second photosensors to a common storage region;
    forming a second trunk that is split from the first trunk and that includes at least one transistor for reading out a signal representing the photocharges transferred to the common storage region, the at least one transistor having a gate;
    forming a reset transistor for resetting said common storage region;
    forming a row select transistor for providing said signal as an output signal, wherein respective gates of said at least one transistor, said reset transistor, and said row select transistor are not linearly aligned; and forming a first electrode over the gate of the at least one transistor, wherein the gate of the at least one transistor is configured to act as a second electrode, and wherein the first and second electrodes form a capacitor that provides additional charge storage capacity for the common storage region.

2. The method of claim 1, wherein the at least one transistor comprises a source follower transistor.

3. The method of claim 1, wherein the act of forming first and second photosensors comprises forming row adjacent photosensors.

4. The method of claim 3, wherein the first trunk is formed in an area above and at least partially between the photosensors.

5. The method of claim 4, wherein the second trunk is formed adjacent one of the first and second photosensors.

6. The method of claim 1, wherein said second trunk includes only one of said reset transistor and said row select transistor.

7. A pixel cell array comprising:
   first and second photosensors for generating photocharges in response to applied light;
   a first trunk including a transfer gate, the transfer gate for transferring the photocharges from each of the first and second photosensors to a common storage region;
   a second trunk that is split from the first trunk and that includes at least one transistor for reading out a signal representing the photocharges transferred to the common storage region, the at least one transistor having a gate;
   a reset transistor for resetting said common storage region;
   a row select transistor for providing said signal as an output signal, wherein respective gates of said at least one transistor, said reset transistor, and said row select transistor are not linearly aligned; and
   a capacitor coupled in parallel with the reset transistor.

8. The pixel array of claim 7, wherein the at least one transistor comprises a source follower transistor.

9. The method of claim 7, wherein said first and second photosensors comprise row adjacent photosensors.

10. The method of claim 9, wherein the first trunk is in an area above and at least partially between the photosensors.

11. The method of claim 10, wherein the second trunk is adjacent one of the first and second photosensors.

12. The method of claim 7, wherein said second trunk includes only one of said reset transistor and said row select transistor.

13. A processing system comprising:
   a processor; and
   an imaging device coupled to said processor, said imaging device comprising:
      a pixel array, the pixel array comprising:
         first and second photosensors for generating photocharges in response to applied light, wherein at least one of the first and second photosensors has a length and width;
         a first trunk including a transfer gate, the transfer gate for transferring the photocharges from each of the first and second photosensors to a common storage region, wherein the transfer gate has a side that is not perpendicular to the length and not perpendicular to the width of the at least one of the first and second photosensors;
         a second trunk that is split from the first trunk and that includes at least one transistor, the at least one transistor having a gate;
         a reset transistor for resetting said common storage region; and
         a row select transistor for providing an output signal based on the photocharges stored in said common storage region, wherein respective gates of said at least one transistor, said reset transistor, and said row select transistor are not linearly aligned.

* * * * *